United States Patent
Miyahara et al.

(10) Patent No.: US 12,243,910 B2
(45) Date of Patent: Mar. 4, 2025

(54) SILICON CARBIDE SEMICONDUCTOR DEVICE WITH OVERLAPPING ELECTRIC FIELD RELAXATION REGIONS AND METHOD OF MANUFACTURING THE SAME

(71) Applicant: DENSO CORPORATION, Kariya (JP)

(72) Inventors: Shinichirou Miyahara, Kariya (JP); Masatoshi Tsujimura, Nagakute (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 389 days.

(21) Appl. No.: 17/718,792

(22) Filed: Apr. 12, 2022

(65) Prior Publication Data
US 2022/0246719 A1  Aug. 4, 2022

Related U.S. Application Data

(63) Continuation of application No. PCT/JP2020/038773, filed on Oct. 14, 2020.

(30) Foreign Application Priority Data

Oct. 30, 2019  (JP) .................................. 2019-197841

(51) Int. Cl.
| | |
|---|---|
| H01L 29/06 | (2006.01) |
| H01L 21/04 | (2006.01) |
| H01L 21/76 | (2006.01) |
| H01L 21/761 | (2006.01) |
| H01L 29/10 | (2006.01) |
| H01L 29/16 | (2006.01) |

(Continued)

(52) U.S. Cl.
CPC .......... *H01L 29/063* (2013.01); *H01L 21/046* (2013.01); *H01L 21/7602* (2013.01); *H01L 21/761* (2013.01); *H01L 29/1095* (2013.01); *H01L 29/1608* (2013.01); *H01L 29/66068* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 2009/0146209 | A1* | 6/2009 | Akiyama | ............ H01L 29/1095 257/334 |
| 2017/0263757 | A1* | 9/2017 | Saikaku | .............. H01L 29/0878 |

(Continued)

*Primary Examiner* — Evren Seven
*Assistant Examiner* — Cole Leon Lindsey
(74) *Attorney, Agent, or Firm* — Posz Law Group, PLC

(57) ABSTRACT

A silicon carbide semiconductor device includes an electric field relaxation layer disposed in a drift layer. The electric field relaxation layer includes a first region having a second conductivity type and disposed at a position deeper than trenches, and a second region having the second conductivity type and disposed between the adjacent trenches to be away from a side surface of each of the adjacent trenches. Each of the first region and the second region is made of an ion implantation layer. The electric field relaxation layer further includes a double implantation region in which the first region and the second region overlap with each other, and the electric field relaxation layer has a peak of a second conductivity type impurity concentration in the double implantation region.

13 Claims, 10 Drawing Sheets

(51) Int. Cl.
*H01L 29/66* (2006.01)
*H01L 29/78* (2006.01)

(56) References Cited

U.S. PATENT DOCUMENTS

| | | |
|---|---|---|
| 2019/0288107 A1 | 9/2019 | Saikaku et al. |
| 2020/0203482 A1 | 6/2020 | Kaji et al. |

* cited by examiner

SILICON CARBIDE SEMICONDUCTOR DEVICE WITH OVERLAPPING ELECTRIC FIELD RELAXATION REGIONS AND METHOD OF MANUFACTURING THE SAME

CROSS REFERENCE TO RELATED APPLICATIONS

The present application is a continuation application of International Patent Application No. PCT/JP2020/038773 filed on Oct. 14, 2020, which designated the U.S. and claims the benefit of priority from Japanese Patent Application No. 2019-197841 filed on Oct. 30, 2019. The entire disclosures of all of the above applications are incorporated herein by reference.

TECHNICAL FIELD

The present disclosure relates to a silicon carbide (SiC) semiconductor device and a method of manufacturing an SiC semiconductor device.

BACKGROUND

Conventionally, there has been known an SiC semiconductor device having a trench gate structure as a structure in which a channel density is increased so as to allow a large current to flow.

SUMMARY

The present disclosure provides a silicon carbide semiconductor device including an electric field relaxation layer disposed in a drift layer. The electric field relaxation layer includes a first region having a second conductivity type and disposed at a position deeper than trenches, and a second region having the second conductivity type and disposed between adjacent trenches to be away from a side surface of each of the adjacent trenches. Each of the first region and the second region is made of an ion implantation layer. The electric field relaxation layer further includes a double implantation region in which the first region and the second region overlap with each other, and the electric field relaxation layer has a peak of a second conductivity type impurity concentration in the double implantation region.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
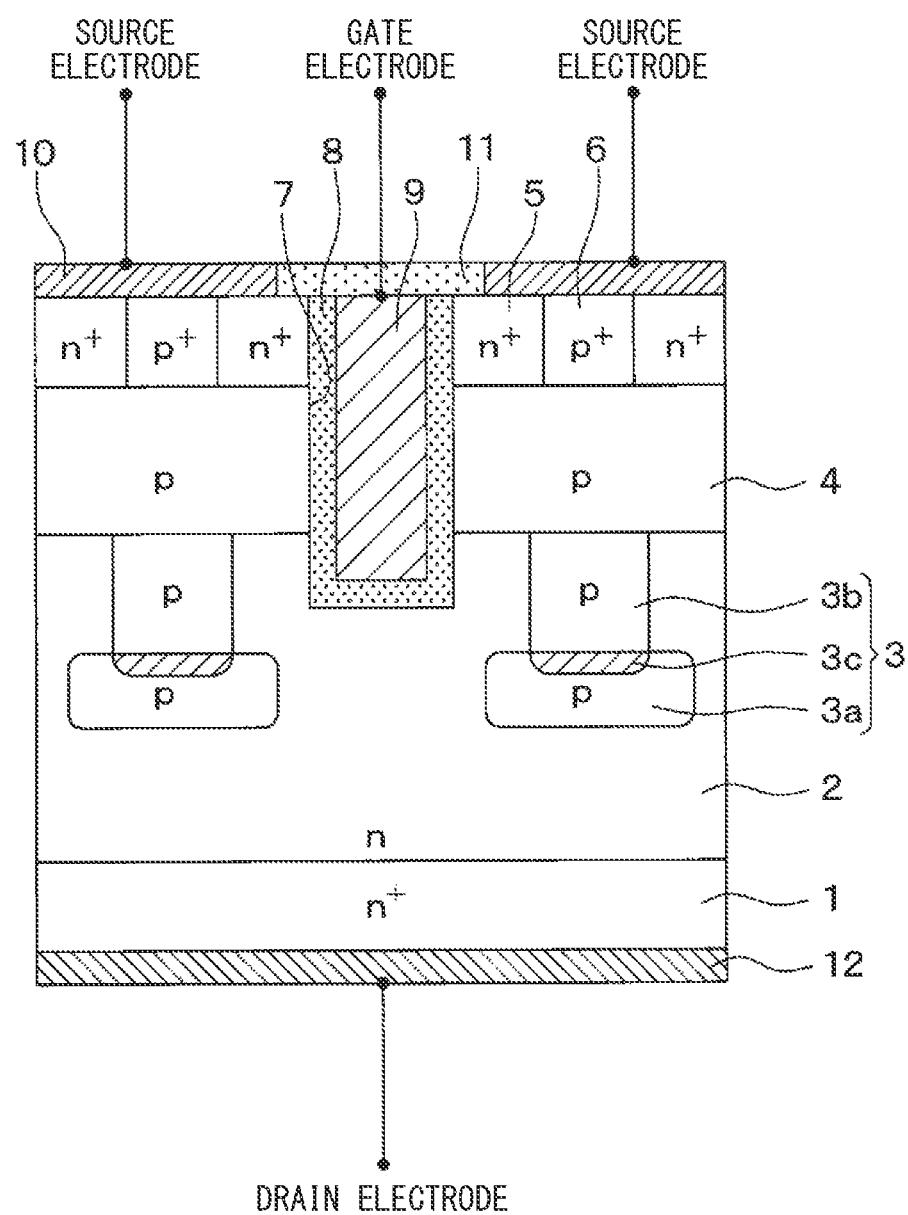
FIG. 1 is a diagram showing a cross-sectional configuration of an SiC semiconductor device according to a first embodiment.

In an SiC semiconductor device having a trench gate structure, a breakdown electric field strength of SiC is high, and there may be a possibility that dielectric breakdown may occur when an electric field stress is applied to a bottom of a trench. In order prevent the dielectric breakdown, p-type electric field relaxation layers may be formed on both sides of a trench gate so as to restrict the application of a high electric field to the bottom of the trench. The electric field relaxation layer may have a two-layer structure including a high concentration region located below and a low concentration region located above. The electric field relaxation layer may be formed by ion implantation or the like.

The present inventors have studied the formation of each layer by ion implantation in cases of forming a p-type electric field relaxation layer having a two-layer structure. Specifically, after forming a part of a drift layer, ion implantation is performed to form a first region located at a lower portion of an electric field relaxation layer. Then, after forming the remaining part of the drift layer, ion implantation is performed again to form a second region located at an upper portion of the electric field relaxation layer. In this way, the electric field relaxation layer can be formed by the two-step ion implantation process. The ion implantation process refers to a process in which multiple implantation conditions having different acceleration energies and implantation amounts are combined, and does not refer only to ion implantation under a single condition.

However, the present inventors have found that the following issues arise when the above-described process is used. Specifically, film thickness variation due to epitaxial growth may occur when forming the remaining part of the drift layer. Further, since an off substrate is used as a semiconductor substrate in order to ensure that epitaxial growth is performed well in SiC, the drift layer formed on the off substrate also has an off angle. When ion implantation is performed on the drift layer having an off angle to form the second region, channeling due to an implantation swing may occur, and an implantation depth may vary. In this way, when the film thickness variation of the remaining part of the drift layer and the implantation depth variation due to channeling occur, there may be a possibility that the second region does not reach the first region, and the first region and the second region are not electrically connected. In that case, the first region becomes a floating state and is not fixed to a source potential, so that the electric field relaxation effect by the electric field relaxation layer cannot be sufficiently obtained. At the same time, the resistance in a p layer increases, which may cause a decrease in breakdown resistance.

A silicon carbide semiconductor device according to an aspect of the present disclosure includes a substrate, a drift layer, a base region, a source region, a contact region, a trench gate structure, a source electrode, a drain electrode, and an electric field relaxation layer. The substrate is made of silicon carbide having a first conductivity type or a second conductivity type, and has a front surface and a rear surface opposite to each other. The drift layer is disposed on the front surface of the substrate and is made of silicon carbide having the first conductivity type with an impurity concentration lower than an impurity concentration of the substrate. The base region is disposed on the drift layer and is made of silicon carbide having the second conductivity type. The source region is disposed in an upper layer portion of the base region and is made of silicon carbide having the first conductivity type with an impurity concentration higher than the impurity concentration of the drift layer. The contact region is disposed at a position different from the source region in the upper layer portion of the base region, and is made of silicon carbide having the second conductivity type with an impurity concentration higher than the impurity concentration of the base region. The trench gate structure includes multiple trenches provided from a surface of the source region to a position deeper than the base region and arranged in parallel with one direction as a longitudinal direction, a gate insulating film covering an inner wall of each of the trenches, and a gate electrode disposed in each of the trenches via the gate insulating film. The source electrode is electrically connected to the source region and the contact region. The drain electrode is disposed on the rear surface of the substrate.

The electric field relaxation layer is disposed in the drift layer and includes a first region and a second region. The first region has the second conductivity type and is disposed at a position deeper than the trenches. The second region has the second conductivity type and is disposed between the adjacent trenches to be away from a side surface of each of the adjacent trenches. The second region has a longitudinal direction in a same direction as the longitudinal direction of the trenches and connects the first region and the base region. Each of the first region and the second region is made of an ion implantation layer. The electric field relaxation layer further includes a double implantation region in which the first region and the second region overlap with each other, and the electric field relaxation layer has a peak of a second conductivity type impurity concentration in the double implantation region.

As described above, the silicon carbide semiconductor device includes the electric field relaxation layer deeper than the trenches, and the electric field relaxation layer includes the first region and the second region made of the ion implantation layers. The electric field relaxation layer further includes the double implantation region in which the first region and the second region overlap with each other, and the electric field relaxation layer has the peak of the second conductivity type impurity concentration in the double implantation region. As a result, the first region is connected to the second region and fixed at the source potential, so that the first region can be prevented from floating. Therefore, it is possible to sufficiently obtain an electric field relaxation effect and a breakdown resistance of the electric field relaxation layer.

A manufacturing method of a silicon carbide semiconductor device according to another aspect of the present disclosure includes: preparing a substrate made of silicon carbide having a first conductivity type or a second conductivity type, the substrate having a front surface and a rear surface opposite to each other; forming a drift layer on the front surface of the substrate, the drift layer made of silicon carbide having the first conductivity type with an impurity concentration lower than an impurity concentration of the substrate; forming an electric field relaxation layer having the second conductivity type in the drift layer; forming a base region made of silicon carbide having the second conductivity type on the electric field relaxation layer and the drift layer; forming a source region in an upper layer portion of the base region, the source region made of silicon carbide having the first conductivity type with an impurity concentration higher than the impurity concentration of the drift layer; forming a contact region at a position different from the source region in the upper layer portion of the base region, the contact region made of silicon carbide having the second conductivity type with an impurity concentration higher than the impurity concentration of the base region; forming a trench penetrating the base region from a surface of the source region to reach the drift layer, the trench being shallower than the electric field relaxation layer and arranged away from the electric field relaxation layer with one direction as a longitudinal direction; forming a gate insulating film on an inner wall of the trench; forming a gate electrode on the gate insulating film in the trench; forming a source electrode electrically connected with the source region and the contact region; and forming a drain electrode on the rear surface of the substrate.

The forming of the drift layer and the forming of the electric field relaxation layer include: forming a part of the drift layer and then forming a first region as a part of the electric field relaxation layer by implanting second conductivity type impurity ions to a surface portion of the part of the drift layer; and forming a remaining part of the drift layer after forming the first region, and then forming a second region as a remaining part of the electric filed relaxation layer by implanting second conductivity type impurity ions to the remaining part of the drift layer. The second region has a longitudinal direction in a same direction as the longitudinal direction of the trench and connected to the first region. The forming of the second region includes implanting the second conductivity type impurity ions to a position deeper than the remaining part of the drift layer to form a double implantation region in which the second region and the first region overlap with each other and in which a peak of a second conductivity type impurity concentration of the electric field relaxation layer is present.

In this way, the electric field relaxation layer deeper than the trench is formed, and the electric field relaxation layer includes the first region and the second region. The ion implantation depth is adjusted so that the double implantation region in which the first region and the second region overlap with each other is formed. As a result, the first region is surely connected to the second region and fixed at the source potential, so that the first region can be prevented from floating. Therefore, it is possible to sufficiently obtain the electric field relaxation effect and the breakdown resistance of the electric field relaxation layer.

The following describes embodiments of the present disclosure with reference to the drawings. In the following embodiments, the same or equivalent parts are denoted by the same reference numerals.

First Embodiment

A first embodiment of the present disclosure will be described. First, an SiC semiconductor device including a vertical MOSFET having an inverted trench gate structure according to the present embodiment will be described with reference to FIG. 1. Although only one cell of the vertical MOSFET is shown in FIG. 1, multiple cells having the same structure as the vertical MOSFET shown in FIG. 1 are arranged adjacent to each other.

As shown in FIG. 1, the vertical MOSFET is formed by using an $n^+$-type semiconductor substrate 1. The $n^+$-type semiconductor substrate 1 is made of an SiC single crystal having a thickness of about 300 µm, which is doped with n-type impurities such as phosphorus or nitrogen at a high concentration, for example, an impurity concentration of $1 \times 10^{19}$ to $1 \times 10^{20}$ cm$^{-3}$. On the $n^+$-type semiconductor substrate 1, an n-type drift layer 2 is disposed. The n-type drift layer 2 is made of an SiC doped with n-type impurities at a lower impurity concentration than the $n^+$-type semiconductor substrate 1, for example, $1 \times 10^{15}$ to $5 \times 10^{16}$ cm$^{-3}$, and has a thickness of about 5 to 15 µm.

In the n-type drift layer 2, multiple electric field relaxation layers 3 doped with p-type 5 impurities such as boron or aluminum are disposed. In the present embodiment, the electric field relaxation layers 3 are extended in one direction as a longitudinal direction, and are arranged in a stripe shape. The electric field relaxation layers 3 are disposed on both sides of the trench gate structure described later, and bottoms of the electric field relaxation layers 3 are deeper than a bottom of the trench gate structure.

More specifically, the electric field relaxation layers 3 are disposed from a position separated from the $n^+$-type semiconductor substrate 1 by a predetermined distance to a surface of the n-type drift layer 2. Each of the electric field relaxation layers 3 includes a first region 3a located on a lower side, that is, adjacent to the $n^+$-type semiconductor substrate 1, and a second region 3b located above the first region 3a.

The widths of the first region 3a and the second region 3b, that is, the dimensions in the direction perpendicular to the longitudinal direction of the trench gate structure in a plane direction parallel to a substrate plane, may be the same, or one of the widths of the first region 3a and the second region 3b may be wider than the width of the other. In the present embodiment, the first region 3a is wider than the second region 3b, and the first region 3a protrudes from both sides of the second region 3b. For example, the width of the first region 3a is 1.3 µm, the width of the second region 3b is 0.7 µm, and the amount of protrusion of the first region 3a from the second region 3b is 0.3 µm on one side. According to the above configuration, the expansion of a JFET region between the adjacent electric field relaxation layers 3 can be prevented, and the shortest current path between the trench gate structure and a drain electrode 12 can be secured, and the increase in on-resistance can be suppressed.

The first region 3a is disposed at a position about 0.5 to 2.0 µm away from the surface of the n-type drift layer 2. For example, the p-type impurity concentration the first region 3a is about $1 \times 10^{16}$ to $1 \times 10^{19}$ cm$^{-3}$, and the depth of the first region 3a is about 1.0 to 2.0 µm. On the other hand, the second region 3b is formed from the surface of the n-type drift layer 2 to a depth of about 0.5 to 2.0 µm. The p-type impurity concentration of the second region 3b is set to be higher than that of the first region 3a. For example, the second region 3b has a p-type impurity concentration of about $1 \times 10^{17}$ to $1 \times 10^{20}$ cm$^{-3}$ and a depth of about 1.0 to 2.0 µm.

Further, as will be described later, both the first region 3a and the second region 3b are ion-implanted layers formed by ion-implanting p-type impurities, and the first region 3a and the second region 3b are partially overlapped so as to form a double implantation region 3c. Since the double implantation region 3c is formed, the first region 3a and the second region 3b are surely connected. In order to electrically connect the first region 3a and the second region 3b, it is sufficient that the first region 3a and the second region 3b are in contact with each other. However, due to the influence of a film thickness variation of the n-type drift layer 2, there is a possibility that the first region 3a and the second region 3b will be separated from each other. Therefore, even if the film thickness of the n-type drift layer 2 varies, the double implantation region 3c is formed with a certain thickness.

Figure 2:
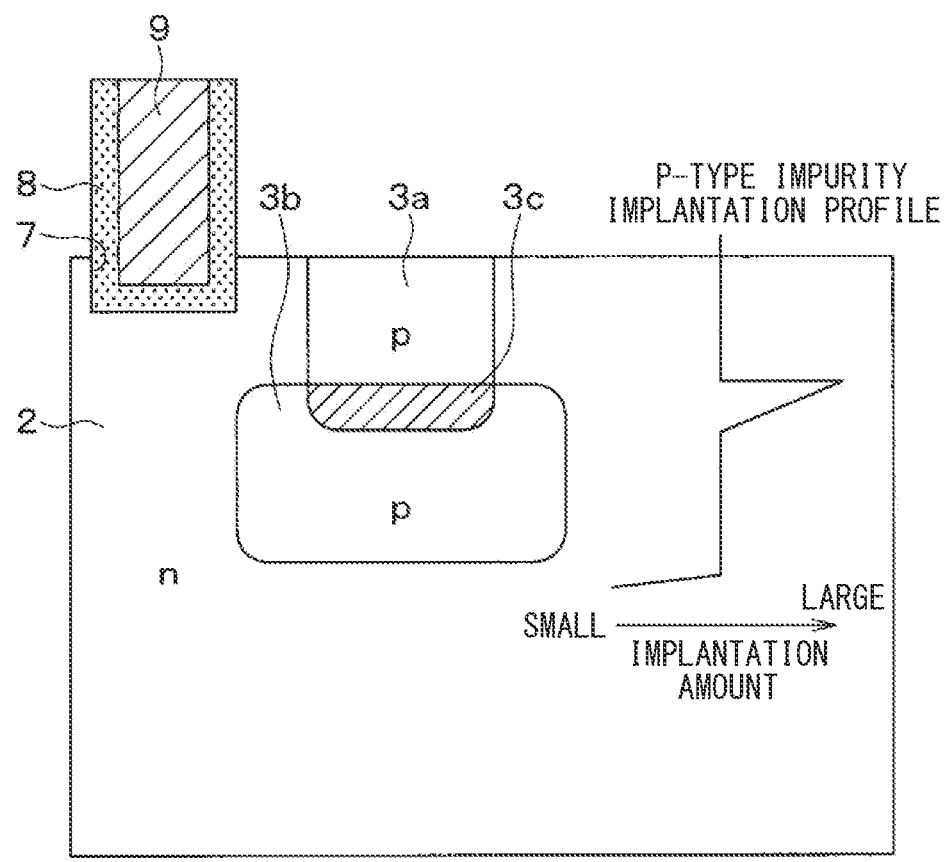
FIG. 2 is a diagram schematically showing the relationship between a position of each part of an electric field relaxation layer and an implantation profile of p-type impurities.

FIG. 2 schematically shows the relationship between a position of each part of the electric field relaxation layer 3 and an implantation profile of the p-type impurities. As shown from FIG. 2, the p-type impurity concentration of the double implantation region 3c is set to be higher than the p-type impurity concentrations of the first region 3a and the second region 3b. Further, in the depth direction, the electric field relaxation layer 3 has a peak of the p-type impurity concentration in the double implantation region 3c. The double implantation region 3c has a thickness of 0.1 µm or more, for example. The concentration profile of the p-type impurity has the peak in a range about 0.05 to 0.2 µm in the depth direction, and the p-type impurity concentration at the peak is $1 \times 10^{17}$ to $1 \times 10^{20}$ cm$^{-3}$, for example.

The first region 3a and the second region 3b are made uniform with the above-described impurity concentration in the entire region other than the double implantation region 3c.

Further, as shown in FIG. 1, a p-type base region 4 is disposed on the surfaces of the n-type drift layer 2 and the electric field relaxation layers 3. The p-type base region 4 is a layer forming a channel of the vertical MOSFET, and is formed so as to be in contact with both side surfaces of a trench 7 that forms a trench gate structure described later.

In a surface layer portion of the p-type base region 4, $n^+$-type source regions 5 are disposed at positions closer to the trench gate structure than positions corresponding to the electric field relaxation layers 3 so as to be in contact with the trench gate structure. The $n^+$-type source regions 5 are doped with n-type impurities at a high concentration. In the present embodiment, for example, the $n^+$-type source regions 5 have an impurity concentration of about $1 \times 10^{20}$ cm$^{-3}$ and a thickness of about 0.3 μm. Further, in the surface layer portion of the p-type base region 4, p$^+$-type contact regions 6 are disposed at positions different from the n$^+$-type source region 5, specifically, positions corresponding to the electric field relaxation layers 3. The p$^+$-type contact regions 6 are doped with p-type impurities at a high concentration. In the present embodiment, for example, the p$^+$-type contact regions 6 have an impurity concentration of about 1×10$^{20}$ cm$^{-3}$ and a thickness of about 0.3 μm.

Further, in the cross section shown in FIG. 1, the trench 7 is provided at a central position between the electric field relaxation layers 3 arranged adjacent to each other. The trench 7 penetrates the p-type base region 4 and the n$^+$-type source region 5 to reach the n-type drift layer 2 and is shallower than the bottoms of the electric field relaxation layers 3. The trench 7 may have any depth as long as the trench 7 is formed deeper than the bottom of the p-type base region 4 and shallower than the electric field relaxation layers 3. For example, the trench 7 protrudes about 0.3 μm from the bottom of the p-type base region 4 and is shallower than the double implantation region 3c.

The p-type base region 4 and the n$^+$-type source regions 5 are disposed so as to be in contact with the side surfaces of the trench 7. An inner wall of the trench 7 is covered with a gate insulating film 8 made of an oxide film or the like, and an inside of the trench 7 is filled with a gate electrode 9 made of doped polysilicon and disposed on a surface of the gate insulating film 8. The trench gate structure has a configuration in which the gate insulating film 8 and the gate electrode 9 are disposed in the trench 7 as described above.

Although not shown in FIG. 1, the trench gate structure has, for example, a strip shape with a direction perpendicular to a paper surface, that is, the same direction as the longitudinal direction of the electric field relaxation layers 3 as a longitudinal direction. Multiple trench gate structures are arranged in a striped pattern at equal intervals in the left-right direction of the paper surface to form the multiple cells.

Further, a source electrode 10 is disposed on the surfaces of the n$^+$-type source regions 5 and the p$^+$-type contact regions 6. The source electrode 10 is made of multiple metals, for example, Ni/Al or the like. Specifically, portions connected to the n$^+$-type source regions 5 are made of a metal that can make ohmic contact with n-type SiC, and portions connected to the p-type base region 4 via the p$^+$-type contact regions 6 are made of a metal that can make ohmic contact with p-type SiC. The source electrode 10 is electrically separated from a gate wiring (not shown) electrically connected to the gate electrode 9 via an interlayer insulating film 11. The source electrode 10 is electrically connected to the n$^+$-type source regions 5 and the p$^+$ type contact regions 6 through contact holes formed in the interlayer insulation film 11.

Further, a drain electrode 12 electrically connected to the n$^+$-type semiconductor substrate 1 is disposed on the rear surface of the n$^+$-type semiconductor substrate 1. With such a structure, the vertical MOSFET of an n-channel inverted type trench gate structure is provided.

In the vertical MOSFET configured as described above, when a gate voltage is applied to the gate electrode 9 in a state where the source voltage is 0 and the drain voltage is, for example, 10 V, portions of the p-type base region 4 being in contact with the side surfaces of the trench 7 become inverted channel regions. Then, an electric current flows between the source electrode 10 and the drain electrode 12 through the channel regions.

On the other hand, when the gate voltage is not applied, a high voltage, for example, 1400 V is applied as the drain voltage in a state where the gate voltage and the source voltage are 0. In SiC devices, which have an electric field breakdown strength nearly 10 times that of silicon devices, an electric field nearly 10 times that of silicon devices is applied to the gate insulating film 8 due to the influence of this voltage, and an electric field concentration may occur in the gate insulating film 8, especially at a portion of the gate insulating film 8 located at the bottom of the trench 7.

However, the SiC semiconductor device according to the present embodiment includes the electric field relaxation layers 3 deeper than the trench 7. Since equipotential lines are pushed down to a drift side by the electric field relaxation layers 3, it is possible to prevent the electric field from concentrating at the portion of the gate insulating film 8 located at the bottom of the trench gate. In particular, by forming the electric field relaxation layers 3 wide and deep, the effect can be increased.

Therefore, it is possible to relax the electric field concentration in the gate insulating film 8, particularly the electric field concentration at the portion of the gate insulating film 8 located at the bottom of the trench 7. Accordingly, it is possible to form a highly reliable SiC semiconductor device capable of preventing the gate insulating film 8 from being broken down.

Further, in the present embodiment, the double implantation region 3c is provided so that the first region 3a and the second region 3b can be surely connected. If the first region 3a and the second region 3b are not connected, the first region 3a cannot be fixed to the source potential and becomes a floating state. However, in the present embodiment, since the first region 3a and the second region 3b are connected, the first region 3a can be surely fixed to the source potential. Accordingly, it is possible to surely obtain the above effects.

Next, a method of manufacturing the trench gate type vertical MOSFET shown in FIG. 1 will be described with reference to FIGS. 3A to 3G.

Figure 3A:
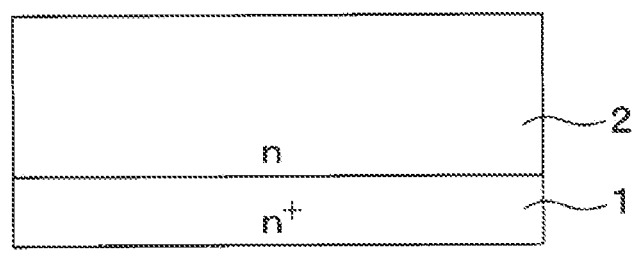
FIG. 3A is a cross-sectional view showing a manufacturing process of the SiC semiconductor device shown in FIG. 1.

[Process Shown in FIG. 3A]

First, an epitaxial substrate in which the n-type drift layer 2 is epitaxially grown on the front surface of the n$^+$-type semiconductor substrate 1 is prepared. The n$^+$-type semiconductor substrate 1 has an off-angle and is made of an SiC single crystal doped with n-type impurities at a high concentration. However, at this time, not all of the n-type drift layer 2 is formed, and a part of the n-type drift layer 2 on a surface side is not yet formed.

Figure 3B:
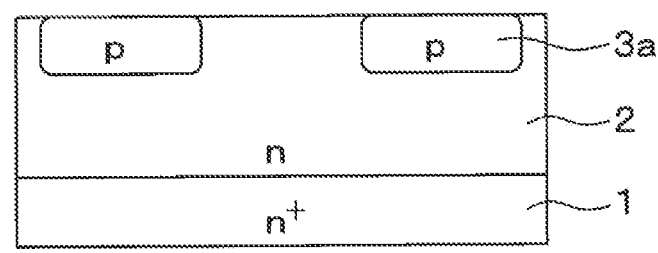
FIG. 3B is a cross-sectional view showing a manufacturing process of the SiC semiconductor device continued from FIG. 3A.

[Process Shown in FIG. 3B]

An ion implantation mask (not shown) is placed on the n-type drift layer 2, and p-type impurity ions are implanted into a surface layer portion of the n-type drift layer 2 using the mask to form the first region 3a.

Figure 3C:
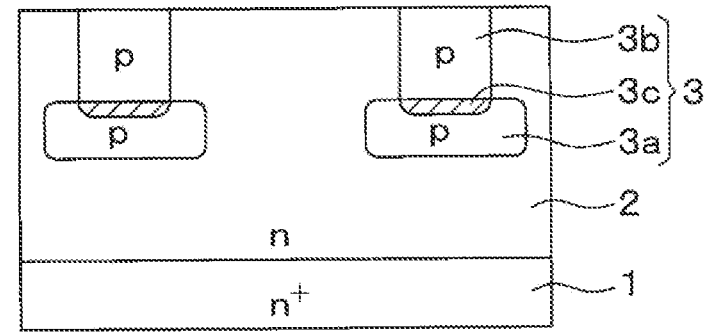
FIG. 3C is a cross-sectional view showing a manufacturing process of the SiC semiconductor device continued from FIG. 3B.

[Process Shown in FIG. 3C]

After removing the mask for the ion implantation, the remaining part of the n-type drift layer 2 is epitaxially grown. Further, an ion implantation mask (not shown) is placed, and the p-type impurity ions are implanted into the newly formed part of the n-type drift layer 2 using the mask. Then, the implanted impurities are activated by heat treatment or the like to form the second region 3b, and then the ion implantation mask is removed. As a result, the electric field relaxation layer 3 is formed in which the first region 3a and the second region 3b are connected and the overlapped portion of the first region 3a and the second region 3b is the double implantation region 3c. Both the first region 3a and the second region 3b can be formed by ion implantation after forming the n-type drift layer 2, but if ion implantation is performed to a deep position, a large amount of ion implantation energy is required. Therefore, the first region 3a is formed after a part of the n-type drift layer 2 is formed, and then the second region 3b is formed after the remaining part of the n-type drift layer 2 is formed. In this way, the depth can be secured by adding the electric field relaxation layers 3 to form a two-layer structure.

When the remaining part of the n-type drift layer 2 is epitaxially grown after the first region 3a is formed, the film thickness variation may occur. For example, when the film thickness is 0.7 µm, a variation of ±0.07 µm may occur. Further, in order to ensure that epitaxial growth is performed well in SiC, an off substrate is used as the $n^+$-type semiconductor substrate 1. However, in that case, the off angle is inherited by the n-type drift layer 2 that is epitaxially grown. When ion implantation is performed on the n-type drift layer 2 having such an off angle, the ion implantation depth varies due to channeling. Specifically, when the n-type drift layer 2 has an off angle of 4 degrees, the depth varies by about 0.1 µm due to channeling by an ion implantation swing of ±2 degrees.

Therefore, it is necessary to form the double implantation region 3c with taking the maximum film thickness variation of 0.07 µm of the remaining part of the n-type drift layer 2 and the maximum depth variation of 0.1 µm due to channeling into consideration so as to connect the region 3a and the second region 3b. Since the sum of the maximum film thickness variation and the maximum depth variation is 0.17 µm, if the double implantation region 3c is formed to have a thickness of 0.17 µm or more, for example, about 0.2 µm, the first region 3a and the second region 3b can be surely connected. Correspondingly, when the second region 3b is formed by the ion implantation, the p-type impurity ions are implanted to a position deeper than the target film thickness of the remaining part of the n-type drift layer 2 by 0.2 µm.

Accordingly, it is possible to connect the first region 3a and the second region 3b surely. When such ion implantation is performed, the p-type impurity concentration is increased in the double implantation region 3c as compared with the first region 3a and the second region 3b, and the electric field relaxation layer 3 has the peak of the p-type impurity concentration in the depth direction in the double implantation region 3c. This will be described with an example.

Figure 4:
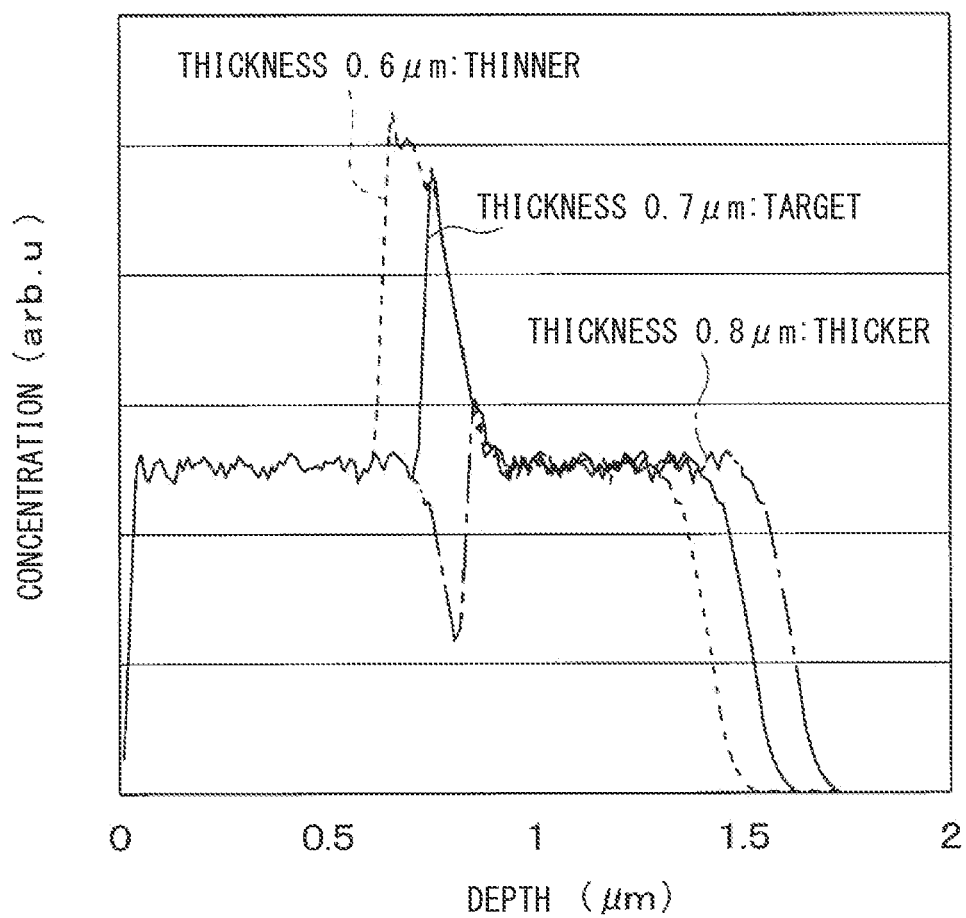
FIG. 4 is a diagram showing results of measuring a p-type impurity concentration of the electric field relaxation layer when a film thickness of a remaining part of an n-type drift layer varies with respect to a target value.

As an example, a target value of the film thickness of the remaining part of the n-type drift layer 2 was set to 0.7 µm, and the p-type impurity concentration of the electric field relaxation layer 3 was measured for each case where the film thickness is the target value and cases where film thickness variation of ±0.1 µm occurs. FIG. 4 shows the results. In this measurement, the ion implantation depth is set to 0.7 µm, which is the target value of the film thickness of the remaining part of the n-type drift layer 2.

As described above, the film thickness variation of the remaining part of the n-type drift layer 2 and the maximum depth variation due to channeling may occur. Therefore, when ion implantation is performed according to the target value of the film thickness, the first region 3a and the second region 3b may or may not be connected.

In the case of the example shown in FIG. 4, when the remaining part of the n-type drift layer 2 is formed with a film thickness of 0.6 µm thinner than the target value or 0.7 µm as the target value, the p-type impurity concentration has a peak.

In the case where the film thickness is thinner than the target value, the ion implantation depth is deeper than the film thickness. Therefore, if the ion implantation depth does not vary to a shallower side due to channeling, it is possible to ensure that the first region 3a and the second region 3b are surely connected to each other. On the other hand, if the film thickness is the same as the target value, the film thickness and the ion implantation depth are the same. Therefore, if the ion implantation depth varies to the shallower side due to channeling, there is a possibility that the first region 3a and the second region 3b are not connected.

Further, when the film thickness becomes thicker than the target value, the first region 3a and the second region 3b are not connected or are not sufficiently connected unless the ion implantation depth vary to a deeper side due to channeling. In the example shown in FIG. 4, when the film thickness is 0.8 µm, the connection between the first region 3a and the second region 3b is not sufficient, and there is a portion where the impurity concentration is lowered.

Therefore, it is necessary to set the ion implantation depth with taking the variations into consideration in order to surely connect the first region 3a and the second region 3b even if the remaining part of the n-type drift layer 2 is formed thicker than the target value or the ion implantation depth varies to the shallower side due to channeling. Specifically, since the sum of the maximum film thickness variation and the maximum depth variation is 0.17 µm, the double implantation region 3c is formed with a thickness of 0.17 µm or more, for example, about 0.2 µm, as described above. Accordingly, the double implantation region 3c is formed, and the first region 3a and the second region 3b can be surely connected to each other. Then, when the double implantation region 3c is formed, the p-type impurity concentration increases at the double implantation region 3c as compared with the first region 3a and the second region 3b other than the double implantation region 3c. Therefore, the electric field relaxation layer 3 has the peak of the p-type impurity concentration in the double implantation region 3c.

Figure 3D:
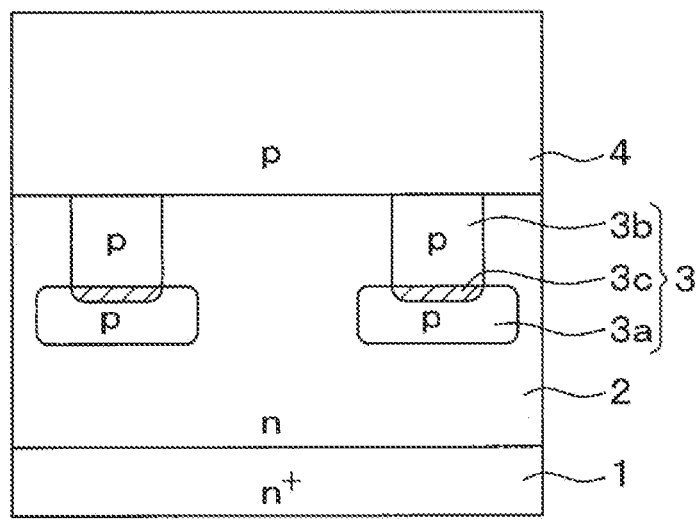
FIG. 3D is a cross-sectional view showing a manufacturing process of the SiC semiconductor device continued from FIG. 3C.

[Process Shown in FIG. 3D]

The p-type base region 4 is epitaxially grown on the surfaces of the n-type drift layer 2 and the electric field relaxation layers 3.

Figure 3E:
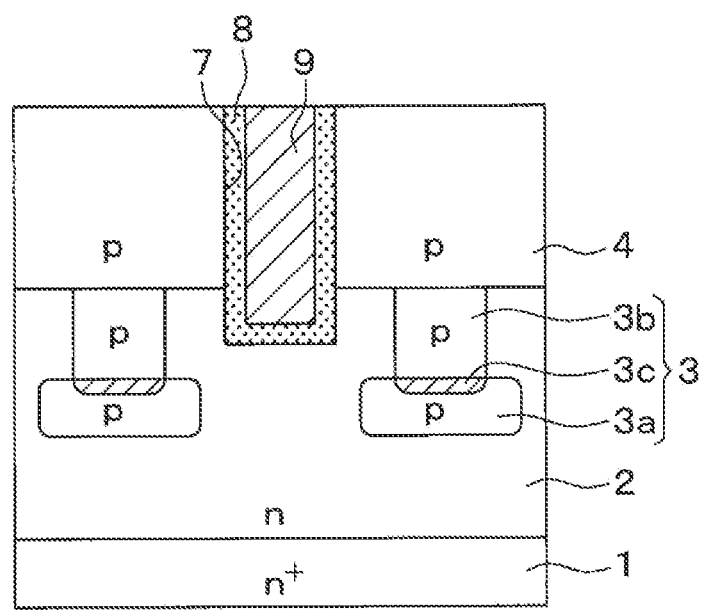
FIG. 3E is a cross-sectional view showing a manufacturing process of the SiC semiconductor device continued from FIG. 3D.

[Process Shown in FIG. 3E]

An etching mask (not shown) covering a surface of the p-type base region 4 and having an opening at a portion where the trench 7 is to be formed is placed on the surface of the p-type base region 4. Then, after anisotropic etching using the etching mask is performed, isotropic etching and a sacrificial oxidation process are performed as necessary to form the trench 7. As a result, the trench 7 penetrating the p-type base region 4 to reach the n-type drift layer 2 is formed so that the trench 7 is shallower than the electric field relaxation layers 3 and is arranged between the adjacent second regions 3b to be away from the second regions 3b.

Next, the etching mask is removed and a gate oxidation process is performed to form the gate insulating film 8. Further, a polysilicon layer doped with impurities is formed on a surface of the gate insulating film 8, and then the polysilicon layer is patterned to form the gate electrode 9. As a result, the trench gate structure is formed.

Figure 3F:
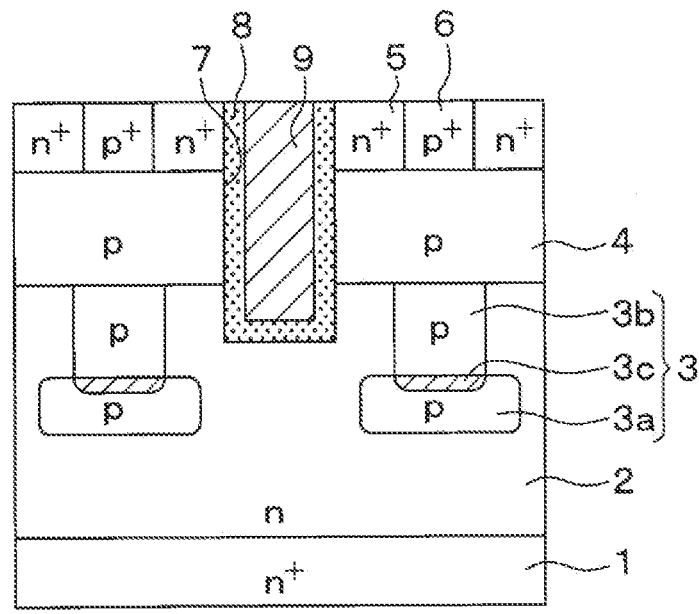
FIG. 3F is a cross-sectional view showing a manufacturing process of the SiC semiconductor device continued from FIG. 3E.

[Process Shown in FIG. 3F]

After a mask (not shown) having openings at positions where the $n^+$-type source regions 5 are to be formed is formed on the surface of the p-type base region 4, n-type impurity ions are implanted at a high concentration from above the mask to form the $n^+$-type source regions 5. Similarly, after a mask (not shown) having openings at positions where the $p^+$-type contact regions 6 are to be formed is formed on the surface of the p-type base region 4, p-type impurity ions are implanted at a high concentration from above the mask to form the $p^+$-type source regions 6.

Figure 3G:
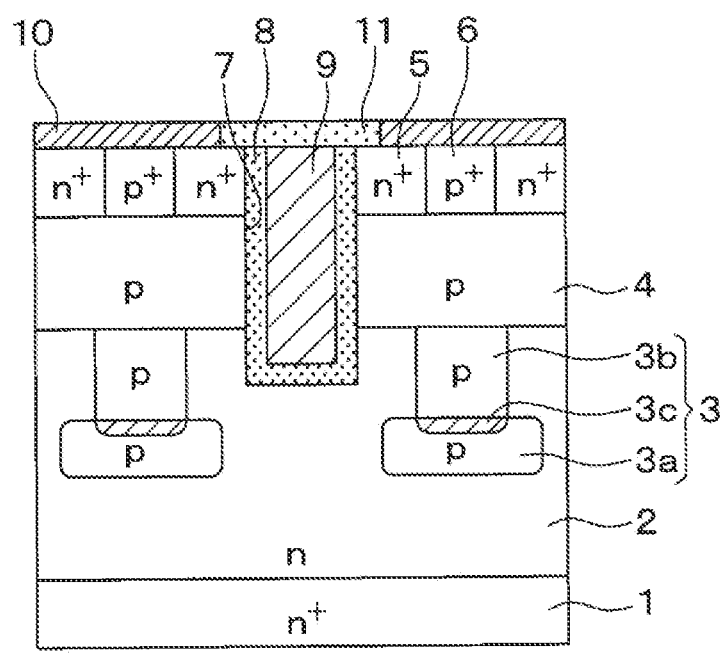
FIG. 3G is a cross-sectional view showing a manufacturing process of the SiC semiconductor device continued from FIG. 3F.

[Process Shown in FIG. 3G]

After forming the interlayer insulating film 11, the interlayer insulating film 11 is patterned to form the contact holes for exposing the n+-type source regions 5 and the p-type base region 4, and a contact hole for exposing the gate electrode 9 in a cross section different from the cross section shown in FIG. 3G. Then, after forming an electrode material to be embedded in the contact holes, the source electrode 10 and a gate wiring (not shown) are formed by patterning the electrode material.

After that, by forming the drain electrode 12 on the rear surface of the n+-type semiconductor substrate 1, the vertical MOSFET shown in FIG. 1 is completed.

As described above, in the present embodiment, the ion implantation depth of the p-type impurities when forming the second region 3b is set to be deeper than the thickness of the portion of n-type drift layer 2 located above the first region 3a so that the first region 3a and the second region 3b surely overlap each other. Then, the p-type impurity concentration is increased in the double implantation region 3c as compared with the portions of the first region 3a and the second region 3b different from the double implantation region 3c, and the electric field relaxation layer 3 has the peak of the p type impurity concentration in the depth direction in the double implantation region 3c. As a result, the first region 3a is connected to the second region 3b and is fixed to the source potential. Thus, the first region 3a can be prevented from floating. Therefore, it is possible to sufficiently obtain the electric field relaxation effect of the electric field relaxation layers 3.

Second Embodiment

A second embodiment will be described. Since the present embodiment is similar to the first embodiment except that the p-type impurity concentration of the electric field relaxation layers is changed as compared with the first embodiment, only portions different from the first embodiment will be described.

As described in the first embodiment, when the first region 3a and the second region 3b are both formed by ion implantation to be overlapped with each other, the double implantation region 3c in which the ion implantation is performed twice is formed. Since the impurity concentration is high in the double implantation region 3c, implantation defects may occur due to the presence of many out-of-lattice atoms. This implantation defects create a new energy level, and when a depletion layer reaches the double implantation region 3c when the drain voltage is applied, carriers are generated and can be a leak source. In order to prevent the depletion layer from reaching the double implantation region 3c, the electric field relaxation layer 3 may have a high concentration to prevent the depletion layer from spreading inside the electric field relaxation layer 3. However, in a case where the electric field relaxation layer 3 has a high concentration, especially when the entire region of the first region 3a located at a lower portion the electric field relaxation layer 3 is set to a high concentration region, the extending amount of the depletion layer toward the n-type drift layer 2 is increased, and a breakdown voltage may be decreased.

Therefore, in the present embodiment, the p-type impurity concentration of the first region 3a is set to be relatively low so that the p-type impurity concentration of the second region 3b is higher than the p-type impurity concentration of the first region 3a. For example, the first region 3a has the p-type impurity concentration of about $1 \times 10^{16}$ to $1 \times 10^{18}$ cm$^{-3}$, and the second region 3b has the p-type impurity concentration of about $1 \times 10^{17}$ to $1 \times 10^{20}$ cm$^{-3}$.

As described above, in the present embodiment, since the p-type impurity concentration in the second region 3b is higher than that in the first region 3a, when a high voltage is applied as the drain voltage, the depletion layer extending in the electric field relaxation layer 3 can be prevented from contacting the double implantation region 3c. When the depletion layer comes into contact with the double implantation region 3c, the implantation defects generated in the double implantation region 3c becomes a carrier generation factor and becomes a leak source. Therefore, the leakage can be suppressed by preventing the depletion layer extending in the electric field relaxation layer 3 from coming into contact with the double implantation region 3c. Specifically, it will be described with reference to simulation results.

Figure 5A:
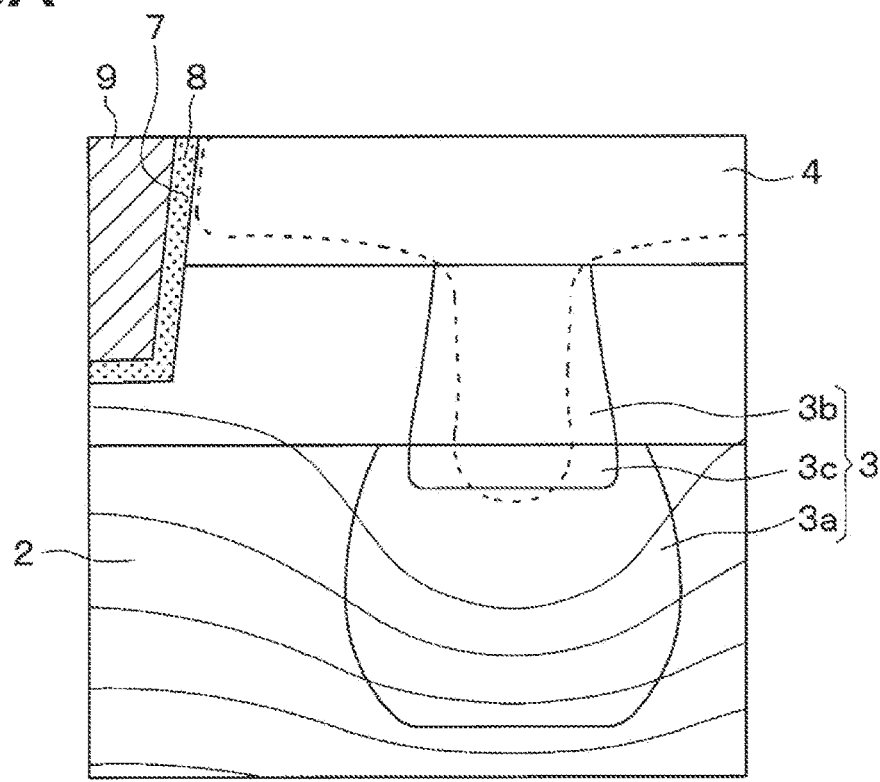
FIG. 5A is a cross-sectional view showing an equipotential distribution and a state of a depletion layer for a comparative example.

FIG. 5A is a simulation result of a comparative example, and shows an equipotential distribution and the state of the depletion layer extending in the electric field relaxation layer 3 when the first region 3a and the second region 3b have the same concentration. The equipotential distribution is shown by thin lines, and the depletion layer is shown by a broken line. If the p-type impurity concentration in the first region 3a is too high, the breakdown voltage will be decreased. Therefore, the simulation is performed by making the p-type impurity concentration of the first region 3a equal to the p-type impurity concentration of the second region 3b without increasing the p-type impurity concentration. In the comparative example, the p-type impurity concentration is set to about $5 \times 10^{17}$ cm$^{-3}$ in the entire region of the first region 3a and the second region 3b and the drain voltage is set to 1400 V. As shown in FIG. 5A, since the p-type impurity concentrations in the first region 3a and the second region 3b are low, the depletion layer penetrates inward the entire region of the electric field relaxation layer 3. Therefore, the depletion layer is in contact with the double implantation region 3c, and the double implantation region 3c becomes a leak source.

Figure 5B:
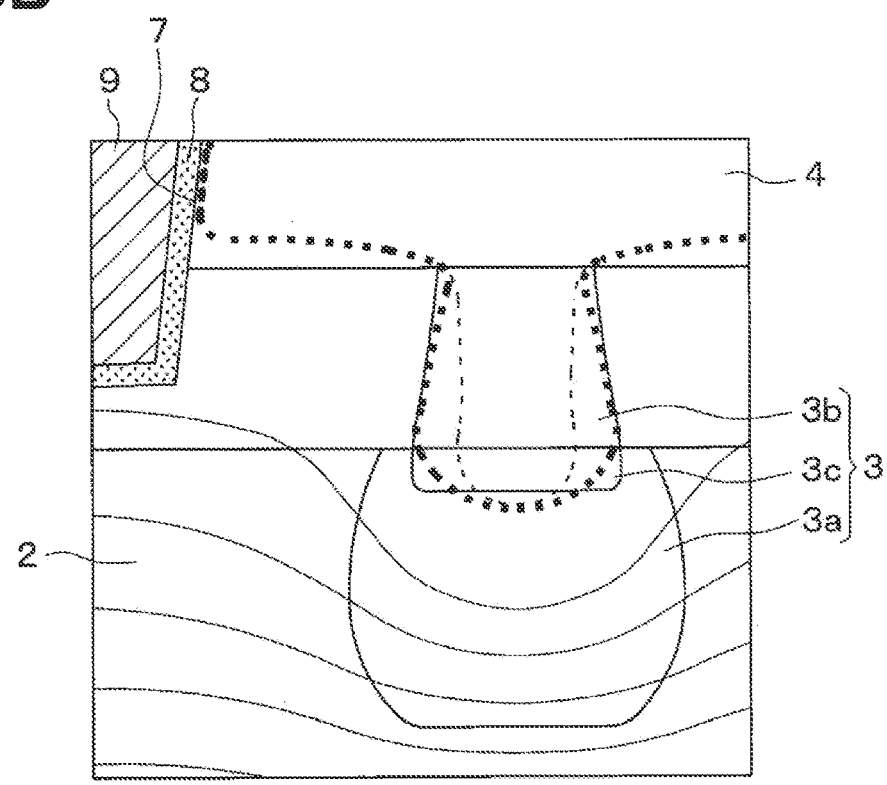
FIG. 5B is a cross-sectional view showing an equipotential distribution and a state of a depletion layer of an SiC semiconductor device according to a second embodiment.

FIG. 5B is a simulation result of the present embodiment, and shows the equipotential distribution and the state of the depletion layer extending in the electric field relaxation layer 3 when the p-type impurity concentration of the second region 3b is higher than the p-type impurity concentration of the first region 3a. As a reference, the depletion layer in the case of FIG. 5A is shown by a thin broken line, and the depletion layer according to the simulation result of the present embodiment is shown by a thick broken line. In the present embodiment, the p-type impurity concentration is set to about $5 \times 10^{17}$ cm$^{-3}$ in the entire region of the first region 3a, the p-type impurity concentration is set to about $1 \times 10^{18}$ cm$^{-3}$ in the entire region of the second region 3b, and the drain voltage is set to 1400 V.

However, when the p-type impurity concentration of the second region 3b is increased, the invasion of the depletion layer is suppressed in a portion of the first region 3a in the vicinity of the second region 3b due to the influence of the second region 3b. Therefore, as shown in FIG. 5B, the depletion layer can be restricted from coming into contact with the double implantation region 3c.

In this way, by increasing the p-type impurity concentration of the second region 3b more than the first region 3a, it is possible to suppress the contact of the depletion layer with the double implantation region 3c, and it is possible to suppress leakage. Although the p-type impurity concentration is made uniform in the entire region of the second region 3b in the above example, the p-type impurity concentration may be increased more than the first region 3a at least at a portion of the second region 3b adjacent to the first region 3a, that is, the lower portion of the second region 3b. In that case, the second region 3b may be divided into an upper portion and a lower portion each having a uniform concentration, and the lower portion may have a higher p-type impurity concentration than the upper portion. In another example, the second region 3b may have a configuration in which a concentration gradient is provided so that the p-type impurity concentration gradually increases downward.

According to the present embodiment, it is possible to suppress leakage while obtaining a high breakdown voltage by the electric field relaxation layer 3, and it is possible to suppress a decrease in reliability of the trench gate. This makes it possible to obtain an SiC semiconductor device having a trench gate structure with high breakdown voltage and high reliability.

A method of manufacturing the trench gate type vertical MOSFET configured in this manner is substantially the same as that in the first embodiment, and it is only necessary to change the dose amount of the p-type impurity at the time of forming the first region 3a and the second region 3b in the processes shown in FIGS. 3B and 3C.

Third Embodiment

A third embodiment will be described. Since the present embodiment is similar to the second embodiment except that the p-type impurity concentration of the electric field relaxation layers is changed as compared with the second embodiment, only portions different from the second embodiment will be described.

Figure 6:
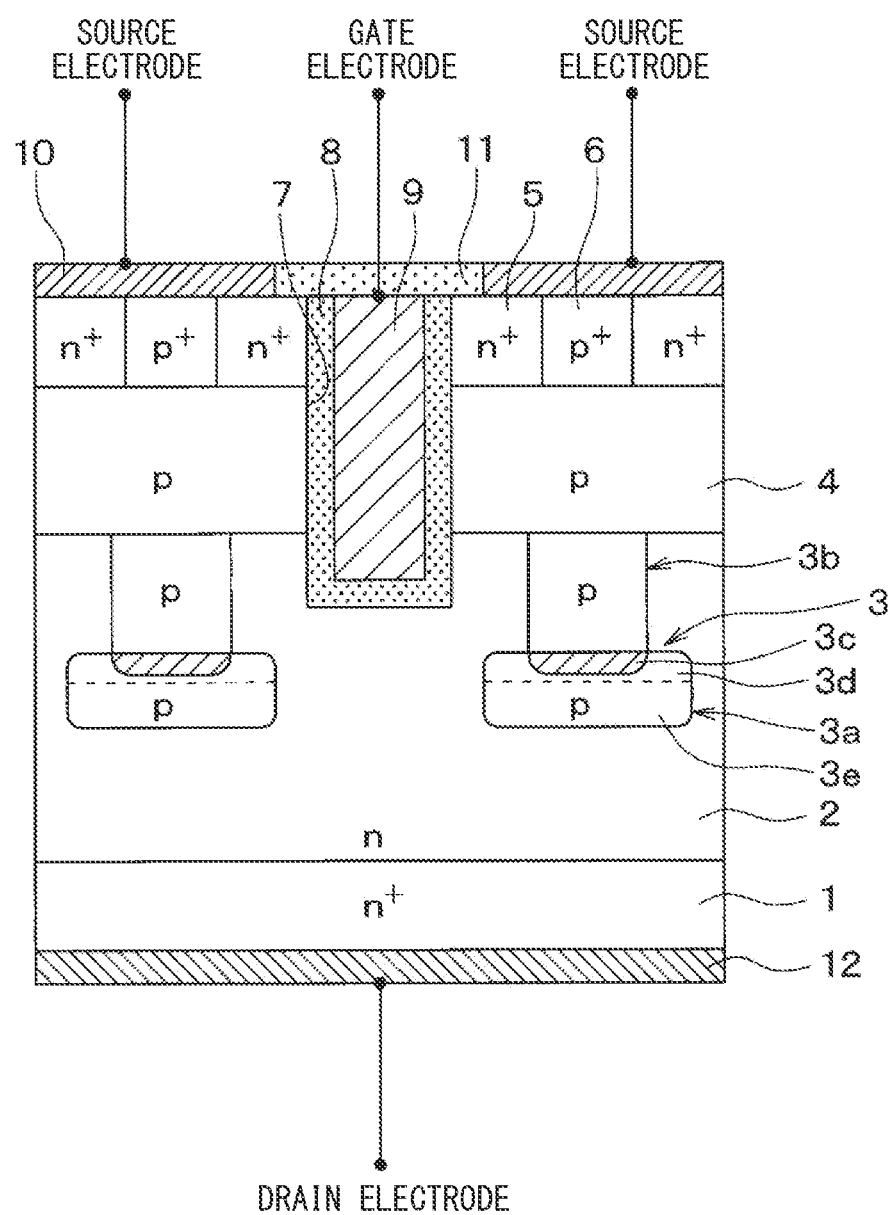
FIG. 6 is a diagram showing a cross-sectional configuration of an SiC semiconductor device according to a third embodiment.

In the present embodiment, as shown in FIG. 6, a p-type impurity concentration of an upper layer portion 3d of the first region 3a, that is, a portion adjacent to the second region 3b including the double implantation region 3c is made higher than a lower layer portion 3e located below the upper layer portion 3b. Specifically, the p-type impurity concentration of the upper layer portion 3d is set to about $1\times10^{17}$ to $1\times10^{20}$ cm$^{-3}$, and the p-type impurity concentration of the lower layer portion 3e is set to about $1\times10^{16}$ to $1\times10^{18}$ cm$^{-3}$. The p-type impurity concentration of the second region 3b is the same as that of the lower layer portion 3e, and is about $1\times10^{16}$ to $1\times10^{19}$ cm$^{-3}$.

In this way, if the p-type impurity concentration is set high in the upper layer portion 3d of the first region 3a, the depletion layer can be restricted from coming into contact with the double implantation region 3c when a high voltage is applied as the drain voltage, as in the first embodiment. Accordingly, effects similar to the first embodiment are achieved. Further, although the p-type impurity concentration in the first region 3a is partially increased, at least the lower layer portion 3e has a lower p-type impurity concentration than the upper layer portion 3d, so that a decrease in breakdown voltage can be suppressed.

Figure 7:
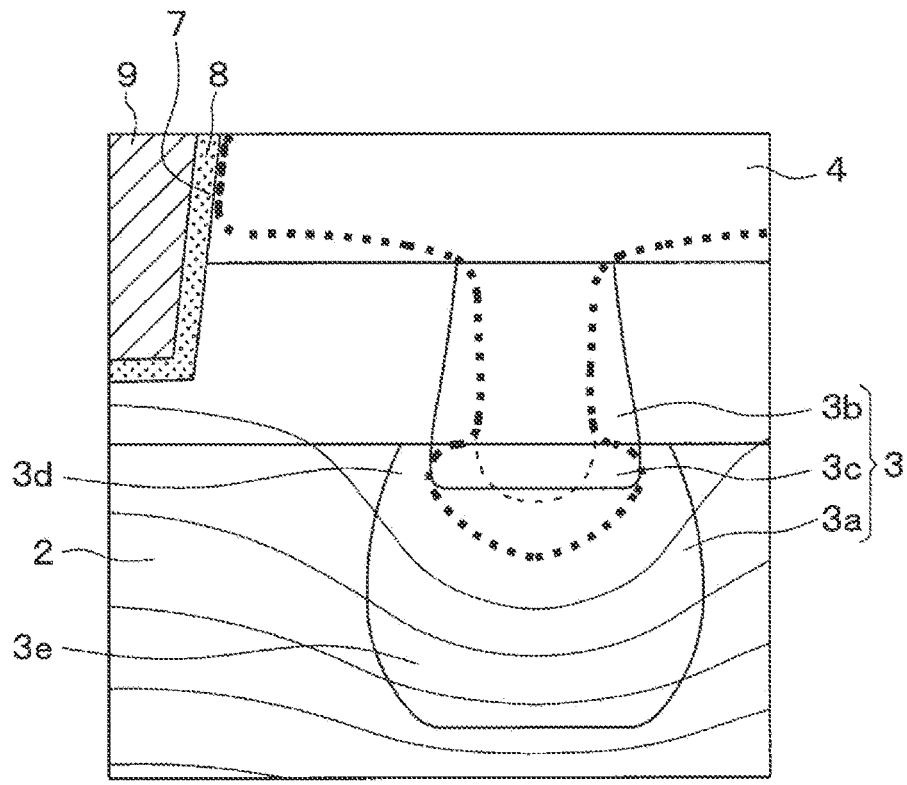
FIG. 7 is a cross-sectional view showing an equipotential distribution and a state of a depletion layer of the SiC semiconductor device according to the third embodiment.

As a reference, a simulation was performed on the SiC semiconductor device having the configuration of the present embodiment. FIG. 7 is the simulation result and shows the equipotential distribution and the state of the depletion layer extending in the electric field relaxation layer 3. As a reference, the depletion layer in the case of FIG. 5A is shown by a thin broken line, and the depletion layer according to the simulation result of the present embodiment is shown by a thick broken line. In the simulation, the drain voltage is set to 1400 V. Further, the p-type impurity concentration of the lower layer portion 3e and the second region 3b is set to about $5\times10^{17}$ cm$^{-3}$, and the p-type impurity concentration of the upper layer portion 3d is set to about $1\times10^{18}$ cm$^{-3}$. As shown in FIG. 7, since the second region 3b is equivalent to the lower layer portion 3e, the depletion layer enters inward more than the first embodiment, but since the p-type impurity concentration is high in the upper layer portion 3d, the depletion layer is less likely to enter the upper layer 3d. In this way, it was confirmed that the depletion layer was restricted from coming into contact with the double implantation region 3c.

Fourth Embodiment

A fourth embodiment will be described. Since the present embodiment is similar to the second and third embodiments except that the p-type impurity concentration of the electric field relaxation layers is changed as compared with the second and third embodiments, only portions different from the second and third embodiments will be described.

In the present embodiment, the p-type impurity concentration of the upper layer 3d of the first region 3a is higher than that of the lower layer 3e as in the third embodiment, and the p-type impurity concentration of the second region 3b is set to be high as with the upper layer portion 3d. Since the p-type impurity concentration of the second region 3b is increased, the extension of the depletion layer into the electric field relaxation layer 3 can be further suppressed, the depletion layer can be restricted from coming into contact with the double implantation region 3c, and the leakage can be further suppressed.

Figure 8:
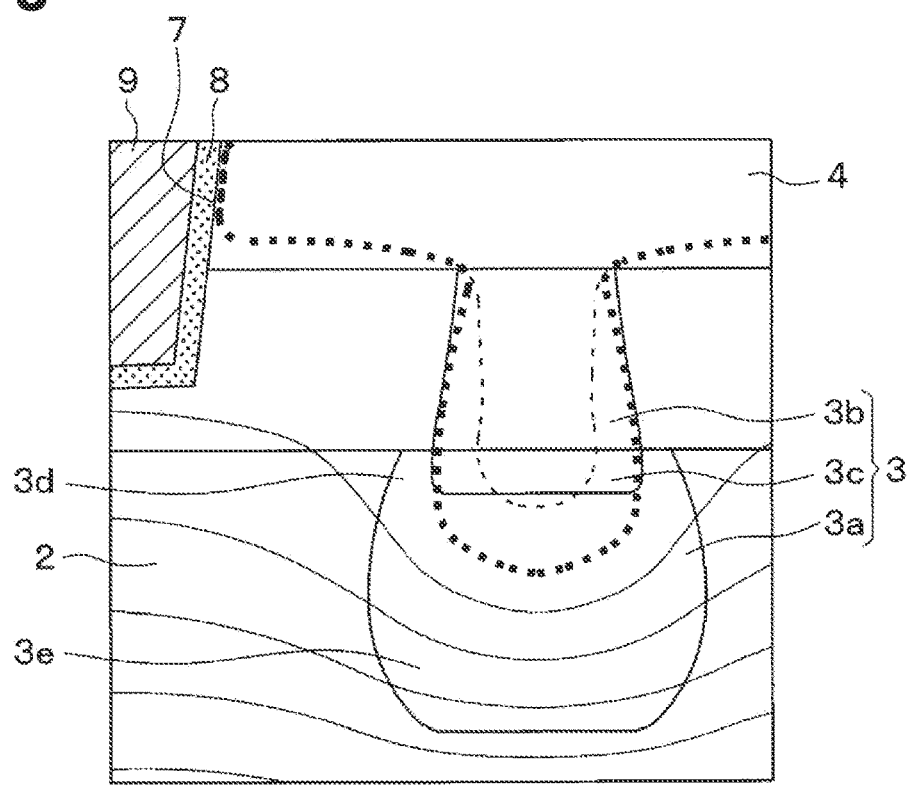
FIG. 8 is a cross-sectional view showing an equipotential distribution and a depletion layer of an SiC semiconductor device according to a fourth embodiment.

As a reference, a simulation was performed on the SiC semiconductor device having the configuration of the present embodiment. FIG. 8 is the simulation result and shows the equipotential distribution and the state of the depletion layer extending in the electric field relaxation layer 3. In the simulation, the drain voltage is set to 1400 V. Further, the p-type impurity concentration of the lower layer portion 3e is set to about $5\times10^{17}$ cm$^{-3}$, and the p-type impurity concentration of the upper layer portion 3d and the second region 3b is set to about $1\times10^{18}$ cm$^{-3}$. As shown in FIG. 8, the depletion layer is less likely to enter the second region 3b as compared with the second embodiment. In this way, it was confirmed that the depletion layer was prevented from coming into contact with the double implantation region 3c.

Fifth Embodiment

A fifth embodiment will be described. Since the present embodiment is similar to the second to fourth embodiments except that the p-type impurity concentration of the electric field relaxation layers is changed as compared with the second to fourth embodiments, only portions different from the second to fourth embodiments will be described. Although a case where a configuration of the present embodiment is applied to the second embodiment is taken as an example here, the configuration of the present embodiment can also be applied to the third and fourth embodiments.

Figure 9:
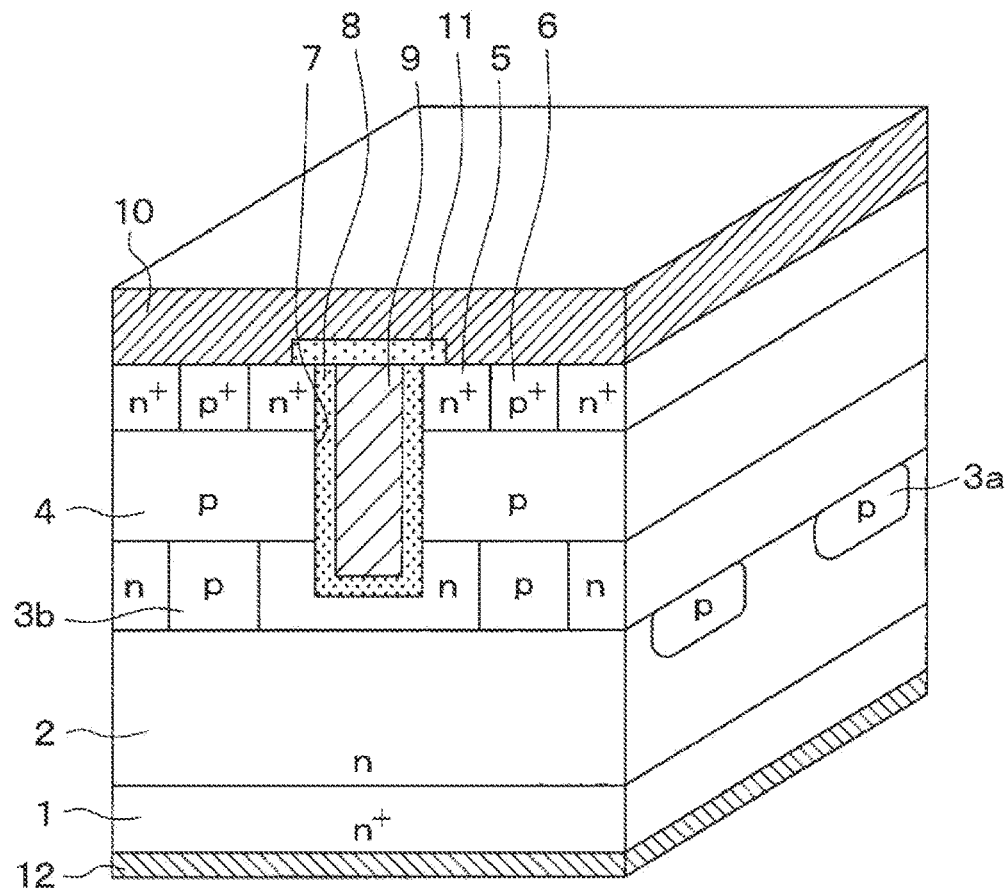
FIG. 9 is a cross-sectional perspective view of an SiC semiconductor device according to a fifth embodiment.
Figure 10:
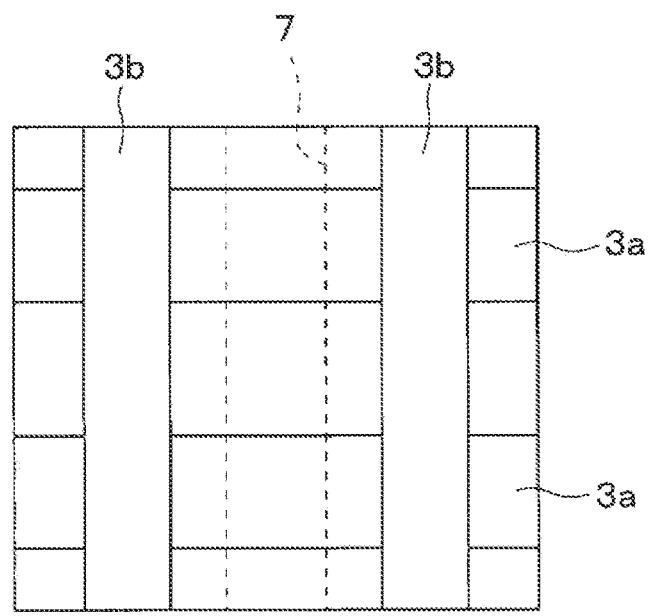
FIG. 10 is a top layout view of the SiC semiconductor device shown in FIG. 9.

In the present embodiment, as shown in FIGS. 9 and 10, the second region 3b has a longitudinal direction in the same direction as the longitudinal direction of the trench gate structure, but the first region 3a has a longitudinal direction in a direction intersecting the second region 3b, in this example, a direction orthogonal to the longitudinal direction of the second region 3b.

In this way, even if the longitudinal direction of the first region 3a and the longitudinal direction of the second region 3b are different, the double implantation region 3c is formed at the intersecting portion. Therefore, if the concentration of the p-type impurity is set to be higher in the second region 3b than in the first region 3a as in the first embodiment, the same effects as the first embodiment can be obtained. Similarly, if the upper layer portion 3d of the first region 3a has a higher p-type impurity concentration than the lower layer portion 3e as in the third and fourth embodiments, the same effects as the third and fourth embodiments can be obtained.

Here, as shown in FIG. 10, the first region 3a and the second region 3b are orthogonal to each other when viewed from the normal direction of the substrate, but at least they may intersect with each other. Further, the first region 3a does not have to be formed into a stripe shape. For example, the first region 3a may formed into a mesh shape having a first portion extending in the same direction as the longitudinal direction of the trench gate structure as in the first to third embodiments and a second portion extending in a direction intersecting the first portion.

Other Embodiments

While the present disclosure has been described in accordance with the embodiment described above, the present disclosure is not limited to the embodiment and includes various modifications and equivalent modifications. In addition, while the various elements are shown in various combinations and configurations, which are exemplary, other combinations and configurations, including more, less or only a single element, are also within the spirit and scope of the present disclosure.

For example, in the first embodiment, an example has been described in which the target value of the film thickness of the portion of the n-type drift layer 2 located above the first region 3a is set to 0.7 μm. However, the target value of the film thickness of the portion of the n-type drift layer 2 located above the first region 3a can be changed as appropriate. Even in that case, if the ion implantation is performed at a depth equal to or greater than the sum of the maximum film thickness variation during epitaxial growth and the maximum depth variation due to channeling, the same effect as that of the first embodiment can be obtained.

Further, in each of the above embodiments, the side surface of the second region 3b is shown so as to be perpendicular to the surface of the n$^+$-type semiconductor substrate 1, but the side surface of the second region 3b does not necessarily have to be perpendicular. For example, as shown as a simulation result in FIG. 5B or the like, the width of the upper portion of the second region 3b may be narrower than that of the lower portion to form a tapered shape in which the side surface of the second region 3b is inclined. On the contrary, the width of the lower portion of the second region 3b may be narrower than that of the upper portion.

Further, regarding the shape of the first region 3a, in each of the above embodiments, the cross section cut in the direction perpendicular to the longitudinal direction of the trench gate structure is shown as a quadrangular shape with rounded corners, but the cross-sectional shape may be an oval shape or the like.

Further, a portion of the n-type drift layer 2 located above the first region 3a, that is, the portion where the second region 3b is formed, may have a higher n-type impurity concentration than the other portion of the n-type drift layer 2. Accordingly, the portion of the n-type drift layer 2 located between the second regions 3b functions as a current dispersion layer having a higher n-type impurity concentration than the portion located below it, and an electric current from the channel can be dispersed over a wider area, and which can contribute to decrease in on-resistance.

Further, in each of the above embodiments, the n-channel type MOSFET in which the first conductive type is n-type and the second conductive type is p-type has been described as an example, but the conductive type of each component may be inverted. The present disclosure can also be applied to p-channel type MOSFETs. Further, in the above description, the MOSFET having the trench gate structure has been described as an example, but the present disclosure can also be applied to an IGBT having a similar trench gate structure. In the IGBT, only the conductivity type of the n$^+$-type substrate 1 is changed from the n type to the p type with respect to each of the above embodiments, and other structures and manufacturing methods are the same as those of the above embodiments.

What is claimed is:

1. A silicon carbide semiconductor device comprising:
   a substrate made of silicon carbide having a first conductivity type or a second conductivity type, and having a front surface and a rear surface opposite to each other;
   a drift layer disposed on the front surface of the substrate and made of silicon carbide having the first conductivity type with an impurity concentration lower than an impurity concentration of the substrate;
   a base region disposed on the drift layer and made of silicon carbide having the second conductivity type;
   a source region disposed in an upper layer portion of the base region and made of silicon carbide having the first conductivity type with an impurity concentration higher than the impurity concentration of the drift layer;
   a contact region disposed at a position different from the source region in the upper layer portion of the base region, and made of silicon carbide having the second conductivity type with an impurity concentration higher than the impurity concentration of the base region;
   a trench gate structure including a plurality of trenches provided from a surface of the source region to a position deeper than the base region and arranged in parallel with one direction as a longitudinal direction, a gate insulating film covering an inner wall of each of the plurality of trenches, and a gate electrode disposed in each of the plurality of trenches via the gate insulating film;
   a source electrode electrically connected to the source region and the contact region;
   a drain electrode disposed on the rear surface of the substrate; and
   an electric field relaxation layer disposed in the drift layer and including a first region and a second region, the first region having the second conductivity type and disposed at a position deeper than the plurality of trenches, the second region having the second conductivity type and disposed between adjacent trenches in the plurality of trenches to be away from a side surface of each of the adjacent trenches, the second region having a longitudinal direction in a same direction as the longitudinal direction of the plurality of trenches and connecting the first region and the base region,
   wherein
   each of the first region and the second region is made of an ion implantation layer, the electric field relaxation layer further includes a double implantation region in which the first region and the second region overlap with each other, and the electric field relaxation layer has a peak of a second conductivity type impurity concentration in the double implantation region.

2. The silicon carbide semiconductor device according to claim 1, wherein
at least a lower portion of the second region adjacent to the first region has a second conductivity type impurity concentration higher than a second conductivity type impurity concentration of the first region.

3. The silicon carbide semiconductor device according to claim 1, wherein
an entire region of the second region has a second conductivity type impurity concentration higher than a second conductivity type impurity concentration of the first region.

4. The silicon carbide semiconductor device according to claim 2, wherein
the first region has the second conductivity type impurity concentration of $1 \times 10^{16}$ to $1 \times 10^{19}$ cm$^{-3}$, and
the at least the lower portion of the second region has the second conductivity type impurity concentration of $1 \times 10^{17}$ to $1 \times 10^{20}$ cm$^{-3}$.

5. The silicon carbide semiconductor device according to claim 1, wherein
the first region includes an upper layer portion adjacent to the second region and a lower layer portion located below the upper layer portion, and
the upper layer portion of the first region has a second conductivity type impurity concentration higher than a second conductivity type impurity concentration of the lower layer portion of the first region.

6. The silicon carbide semiconductor device according to claim 5, wherein
a lower portion of the second region adjacent to the first region has a second conductivity type impurity concentration higher than the second conductivity type impurity concentration of the lower layer portion of the first region.

7. The silicon carbide semiconductor device according to claim 5, wherein
an entire region of the second region has a second conductivity type impurity concentration higher than the second conductivity type impurity concentration of the lower layer portion of the first region.

8. The silicon carbide semiconductor device according to claim 5, wherein
the lower layer portion of the first region has the second conductivity type impurity concentration of $1 \times 10^{16}$ to $1 \times 10^{19}$ cm$^{-3}$, and
the upper layer portion of the first region has the second conductivity type impurity concentration of $1 \times 10^{17}$ to $1 \times 10^{20}$ cm$^{-3}$.

9. The silicon carbide semiconductor device according to claim 1, wherein
the first region has a longitudinal direction in a same direction as the longitudinal direction of the plurality of trenches, and
the first region has a width wider than a width of the second region.

10. The silicon carbide semiconductor device according to claim 1, wherein
the first region has a longitudinal direction in a direction intersecting the longitudinal direction of the plurality of trenches.

11. A manufacturing method of a silicon carbide semiconductor device, comprising:
preparing a substrate made of silicon carbide having a first conductivity type or a second conductivity type, the substrate having a front surface and a rear surface opposite to each other;
forming a drift layer on the front surface of the substrate, the drift layer made of silicon carbide having the first conductivity type with an impurity concentration lower than an impurity concentration of the substrate;
forming an electric field relaxation layer having the second conductivity type in the drift layer;
forming a base region made of silicon carbide having the second conductivity type on the electric field relaxation layer and the drift layer;
forming a source region in an upper layer portion of the base region, the source region made of silicon carbide having the first conductivity type with an impurity concentration higher than the impurity concentration of the drift layer;
forming a contact region at a position different from the source region in the upper layer portion of the base region, the contact region made of silicon carbide having the second conductivity type with an impurity concentration higher than the impurity concentration of the base region;
forming a trench penetrating the base region from a surface of the source region to reach the drift layer, the trench being shallower than the electric field relaxation layer and arranged away from the electric field relaxation layer with one direction as a longitudinal direction;
forming a gate insulating film on an inner wall of the trench;
forming a gate electrode on the gate insulating film in the trench;
forming a source electrode electrically connected with the source region and the contact region; and
forming a drain electrode on the rear surface of the substrate, wherein
the forming of the drift layer and the forming of the electric field relaxation layer include
forming a part of the drift layer and then forming a first region as a part of the electric field relaxation layer by implanting second conductivity type impurity ions to a surface portion of the part of the drift layer, and
forming a remaining part of the drift layer after forming the first region, and then forming a second region as a remaining part of the electric field relaxation layer by implanting second conductivity type impurity ions to the remaining part of the drift layer,
the second region has a longitudinal direction in a same direction as the longitudinal direction of the trench and connected to the first region,
the forming of the second region includes implanting the second conductivity type impurity ions to a position deeper than the remaining part of the drift layer to form a double implantation region in which the second region and the first region overlap with each other and in which a peak of a second conductivity type impurity concentration of the electric field relaxation layer is present.

12. The manufacturing method according to claim 11, wherein
the forming of the second region includes adjusting an implantation amount of the second conductivity type impurity ions in such a manner that at least a portion of the second region adjacent to the first region has a second conductivity type impurity concentration higher than a second conductivity type impurity concentration of the first region.

13. The manufacturing method according to claim 11, wherein the forming of the first region includes adjusting an implantation amount of the second conductivity type impurity ions in such a manner that an upper layer portion of the first region has a second conductivity type impurity concentration higher than a second conductivity type impurity concentration of a lower layer portion of the first region.

* * * * *